United States Patent
Suh (10) Patent No.: US 8,174,179 B2
(45) Date of Patent: May 8, 2012

(54) ORGANIC LIGHT EMITTING DISPLAY APPARATUS

(75) Inventor: Min-Chul Suh, Yongin (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 210 days.

(21) Appl. No.: 12/458,208

(22) Filed: Jul. 2, 2009

(65) Prior Publication Data
US 2010/0007270 A1 Jan. 14, 2010

(30) Foreign Application Priority Data

Jul. 11, 2008 (KR) .................. 10-2008-0067828

(51) Int. Cl.
*H01L 51/50* (2006.01)
*H01L 51/52* (2006.01)

(52) U.S. Cl. ........ 313/501; 313/503; 313/506; 313/509; 313/110; 313/112

(58) Field of Classification Search ........... 313/500–512
See application file for complete search history.

(56) References Cited

U.S. PATENT DOCUMENTS

| | | | | |
|---|---|---|---|---|
| 6,181,062 B1 * | 1/2001 | Hiraishi et al. | ............... | 313/504 |
| 6,888,307 B2 * | 5/2005 | Silvernail et al. | ............. | 313/512 |
| 2004/0043249 A1 * | 3/2004 | Su et al. | ......................... | 313/512 |
| 2004/0195960 A1 * | 10/2004 | Czeremuszkin et al. | ..... | 313/512 |
| 2005/0001545 A1 * | 1/2005 | Aitken et al. | .................. | 313/512 |
| 2005/0116619 A1 * | 6/2005 | Kuma et al. | .................... | 313/503 |
| 2006/0066228 A1 * | 3/2006 | Antoniadis et al. | ........... | 313/506 |
| 2007/0210703 A1 * | 9/2007 | Izzanni et al. | ................ | 313/512 |

FOREIGN PATENT DOCUMENTS

JP 11072778 A * 3/1999

OTHER PUBLICATIONS

English language translation of Yamagishi et al., JP11-72778, published Mar. 16, 1999.

* cited by examiner

*Primary Examiner* — Mariceli Santiago
(74) *Attorney, Agent, or Firm* — Robert E. Bushnell, Esq.

(57) ABSTRACT

A top emission type organic light emitting display apparatus that can improve contrast without using a black matrix and can simply the manufacture of a color filter. The top emission type organic light emitting display apparatus includes a substrate, an organic light emitting device arranged on the substrate and including a first electrode layer and a second electrode layer arranged opposite to each other and an organic light emitting layer arranged between the first electrode layer and the second electrode layer, an encapsulating member arranged to encapsulate the organic light emitting device, a polarizing film arranged on the encapsulating member and a color filter arranged between the encapsulating member and the polarizing film, the color filter being arranged directly on the polarizing film.

15 Claims, 4 Drawing Sheets

ORGANIC LIGHT EMITTING DISPLAY APPARATUS

CLAIM OF PRIORITY

This application makes reference to, incorporates the same herein, and claims all benefits accruing under 35 U.S.C. §119 from an application earlier filed in the Korean Intellectual Property Office on 11 Jul. 2008 and there duly assigned Serial No. 10-2008-0067828.

BACKGROUND OF THE INVENTION

1. Field of the Invention

An organic light emitting display apparatus that can improve contrast without requiring the inclusion of a black matrix and a display that allows for the simple manufacture of a color filter layer.

2. Description of the Related Art

Recently, thin portable flat panel display apparatuses have begun to replace traditional display apparatuses such as cathode ray tubes (CRTs). Among flat panel display apparatuses, organic and inorganic light emitting display apparatuses, which are self-emissive display apparatuses, have attracted a great deal of attention as next generation display apparatuses because of their wide viewing angle, high contrast, and fast response time. Between organic and inorganic light emitting display apparatuses, the organic light emitting display apparatuses have a light emitting layer made out of an organic material are superior in brightness, driving voltage, response speed, and color image reproduction as compared to the inorganic light emitting display apparatuses having a light emitting layer made out of an inorganic material.

Organic light emitting display apparatuses, however, have a problem in that, when there is external light, such as sunlight, the external light is reflected by the organic light emitting display apparatuses, thereby reducing contrast and visibility. In order to solve the problem, attempts have been made to improve contrast by forming a black matrix, which can absorb light impinging at a non-pixel region, to reduce the reflection of external light. However, a process of forming the black matrix on the non-pixel region is complicated.

In order to form a color image, organic light emitting display apparatuses pass generated white light through a color filter so that the white light is divided into three colors of light. However, the color filter is typically formed to alternate with a black matrix on an encapsulation substrate. A process of producing the color filter and the black matrix on the encapsulation substrate is complicated.

SUMMARY OF THE INVENTION

The present invention provides an organic light emitting display apparatus that can improve contrast without using a black matrix.

The present invention also provides an organic light emitting display apparatus that can simplify the manufacture of a color filter.

According to an aspect of the present invention, there is provided a top emission type organic light emitting display apparatus that includes a substrate, an organic light emitting device arranged on the substrate and including a first electrode layer and a second electrode layer arranged opposite to each other and an organic light emitting layer arranged between the first electrode layer and the second electrode layer, an encapsulating member arranged to encapsulate the organic light emitting device, a polarizing film arranged on the encapsulating member and a color filter arranged between the encapsulating member and the polarizing film, the color filter being arranged directly on the polarizing film.

The organic light emitting device can be adapted to emit white light. The color filter can include a red light transmitting region through which light in a red wavelength band passes, a blue light transmitting region through which light in a blue wavelength band passes and a green light transmitting region through which light in a green wavelength band passes. The red light transmitting region, the blue light transmitting region, and the green light transmitting region can be arranged to correspond to light emitting regions of the organic light emitting device.

The color filter can be produced directly on the polarizing film by a photolithography process. The color filter can be produced directly on the polarizing film by a laser induced thermal imaging (LITI) process. The organic light emitting device can also include an adhesive layer arranged in spaces between adjacent ones of the red, green and blue light transmitting regions of the color filter arranged on the polarizing film. The encapsulating member can be a substrate comprised of a glass material. The organic light emitting device can also include a sealing member arranged on the substrate to seal the encapsulating member and the substrate. The sealing member can include frit glass. The encapsulating member can include a plurality of organic layers and a plurality of inorganic layers which are alternately stacked. The organic light emitting device can be a passive matrix type organic light emitting device. The organic light emitting device can be an active matrix type organic light emitting device. The organic light emitting device can also include a buffer layer arranged on the substrate. The polarizing film can include a linear polarizer adhered to a phase retarder.

According to another aspect of the present invention, there is provided a bottom emission type organic light emitting display apparatus including a transparent substrate, an organic light emitting device arranged on the substrate and including a first electrode layer and a second electrode layer arranged opposite to each other and an organic light emitting layer arranged between the first electrode layer and the second electrode layer, an encapsulating member arranged to encapsulate the organic light emitting device, a polarizing film arranged on the substrate and a color filter arranged between the substrate and the polarizing film, the color filter being arranged directly on the polarizing film.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicated the same or similar components, wherein.

DETAILED DESCRIPTION OF THE INVENTION

Figure 1:
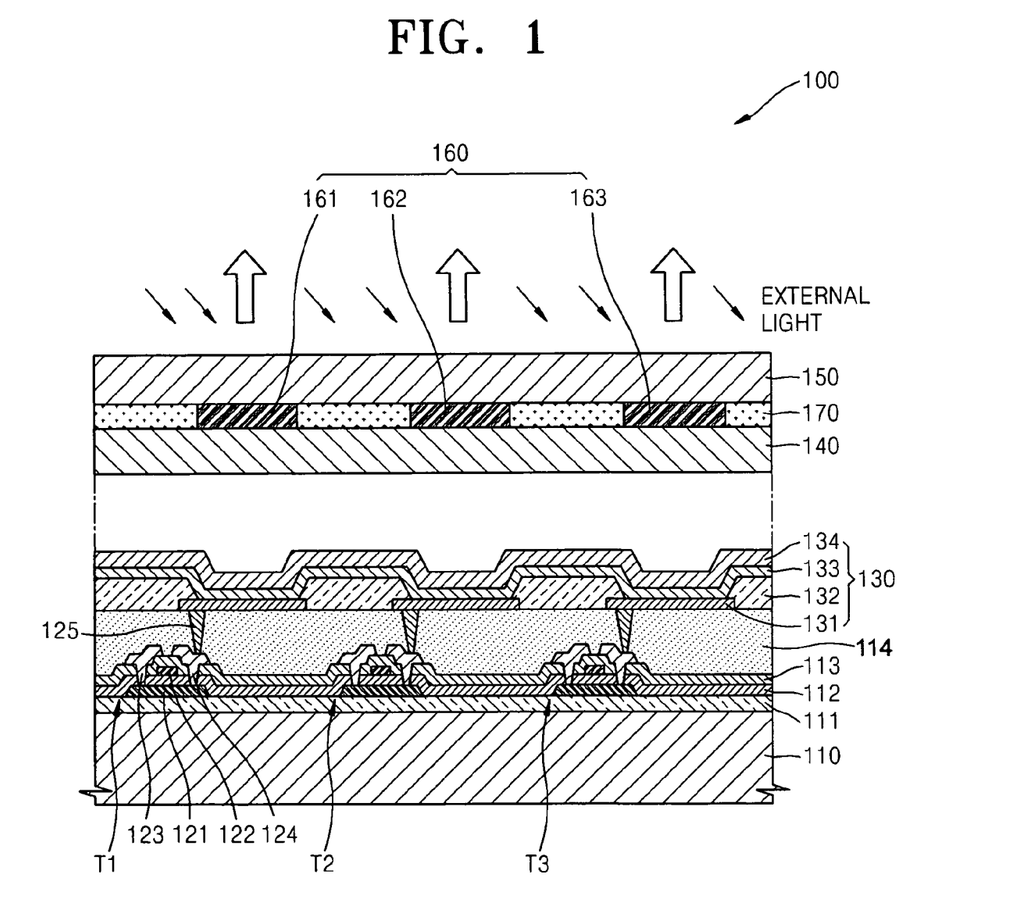
FIG. 1 is a cross-sectional view of an organic light emitting display apparatus according to an embodiment of the present invention.

Turning now to the figures, FIG. 1 is a cross-sectional view of an organic light emitting display apparatus 100 according to an embodiment of the present invention. Organic light emitting display apparatuses are classified into active matrix (AM) type organic light emitting display apparatuses and passive matrix (PM) type organic light emitting display apparatuses. Although the organic light emitting display apparatus 100 of FIG. 1 is an AM type organic light emitting display apparatus, the present invention is not limited thereto and the organic light emitting display apparatus 100 can instead be a PM type organic light emitting display apparatus.

Referring to FIG. 1, the organic light emitting display apparatus 100 includes a substrate 110 including a plurality of thin film transistors (TFTs) T1, T2, and T3, an organic light emitting device 130, an encapsulation substrate 140, and a polarizing film 150, a color filter 160, and an adhesive layer 170 that are arranged on the encapsulation substrate 140.

The substrate 110 can be made out of a transparent glass material containing $SiO_2$ as a main component. However, since the organic light emitting display apparatus 100 is a top emission type organic light emitting display apparatus in which an image is formed in the direction of the encapsulation substrate 140, it is not necessary for substrate 110 to be made out of a transparent material, and can instead be made out of other material such as metal or plastic.

A buffer layer 111, for improving the smoothness of the substrate 110 and preventing impurities from penetrating into the substrate 110, can be formed on a top surface of the substrate 110. The buffer layer 111 can be produced by depositing $SiO_2$ and/or $SiN_x$ on the substrate 110 by plasma enhanced chemical vapor deposition (PECVD), atmospheric pressure chemical vapor deposition (APCVD), low pressure chemical vapor deposition (LPCVD), or the like.

The plurality of TFTs T1, T2, and T3 are formed on the buffer layer 111. At least one TFT constitutes each pixel and is electrically connected to the organic light emitting device 130.

A semiconductor layer 121 having a predetermined pattern is formed on the buffer layer 111. The semiconductor layer 121 can be made out of an organic semiconductor material, or an inorganic semiconductor material, such as amorphous silicon or poly-silicon. Although not shown, the semiconductor layer 121 can include a source region, a drain region, and a channel region.

A gate insulating layer 112, made out of $SiO_2$ or $SiN_x$, is formed on the semiconductor layer 121. A gate electrode 122 is formed on a predetermined portion of the gate insulating layer 121. The gate electrode 122 is connected to a gate line (not shown) that supplies a TFT on/off signal.

An inter-layer insulating layer 113 is formed on the gate electrode 122, and a source electrode 123 and a drain electrode 124 contact the source region and the drain region of the semiconductor layer 121, respectively, through contact holes. The TFTs T1, T2, and T3 constructed as described above are covered and protected by a passivation layer 114.

The passivation layer 114 can be an inorganic insulating layer and/or an organic insulating layer. The inorganic insulating layer can include $SiO_2$, $SiN_x$, SiON, $Al_2O_3$, $TiO_2$, $Ta_2O_5$, $HfO_2$, $ZrO_2$, $(Ba, Sr)TiO_3$ (BST) or Pb $(Zr, Ti)O_3$ (PZT). The organic insulating layer can include poly(methyl methacrylate) (PMMA), polystyrene (PS), a polymer derivative having a phenol group, an acryl-based polymer, an imide-based polymer, an aryl ether-based polymer, an amide-based polymer, a fluorine-based polymer, a p-xylene-based polymer, a vinyl alcohol-based polymer, or a blend thereof. The passivation layer 114 can be a double layer in which an inorganic insulating layer and an organic insulating layer are stacked on each other. Although the organic light emitting display apparatus 100 of FIG. 1 is of a top emission type and the TFTs T1, T2, and T3 are accordingly configured, the present invention is not limited thereto, and it will be understood by one of ordinary skill in the art that the number and shape of the TFTs can be modified.

The organic light emitting device 130 is arranged on the passivation layer 114. The organic light emitting device 130 includes a first electrode layer 131 and a second electrode layer 134 placed opposite to each other, and an organic light emitting layer 133 arranged between the first electrode layer 131 and the second electrode layer 134. The first electrode layer 131 is shown as being electrically connected to drain electrode 124 via contact 125 extending through passivation layer 114.

The first electrode layer 131 can include a reflective layer made out of Ag, Mg, Al, Pt, Pd, Au, Ni, Nd, Ir, Cr, or a compound thereof, and a transparent layer made out of indium tin oxide (ITO), indium zinc oxide (IZO), ZnO, or $In_2O_3$ having a high work function. The first electrode layer 131 can include stripe-shaped lines which are spaced apart from one another by a predetermined distance if the organic light emitting display apparatus 100 of FIG. 1 is a PM type organic light emitting display apparatus. However, since the organic light emitting display apparatus 100 of FIG. 1 is an AM type organic light emitting display apparatus, the first electrode layer 131 can be formed into patterns corresponding to respective pixels. The first electrode layer 131 can act as an anode by being connected to an external terminal (not shown).

A pixel defining layer (PDL) 132 made out of an insulating material is formed on the first electrode layer 131 to cover the first electrode layer 131. A predetermined opening is formed in the PDL 132, and the organic light emitting layer 133 of the organic light emitting device 130 is formed in the opening. When the organic light emitting display apparatus 100 emits white light, the organic light emitting layer 133 is not only formed in the opening, but can be formed on both the first electrode layer 131 and the entire PDL 132 as shown in FIG. 1.

The second electrode layer 134 can be a transmissive electrode, or can be a semi-transmissive layer made out of a thin metal having a low work function such as Li, Ca, LiF/Ca, LiF/Al, Al, Mg, or Ag. High resistance caused by the low thickness of the semi-transmissive layer can be compensated for by disposing a transparent conductive layer made out of ITO, IZO, ZnO, or $In_2O_3$ on the semi-transmitting layer. The second electrode layer 134 can include stripe-shaped lines orthogonal to the stripe-shaped lines of the first electrode layer 131 if the organic light emitting display apparatus 100 of FIG. 1 is a PM type organic light emitting display apparatus. However, since the organic light emitting display apparatus 100 of FIG. 1 is an AM type organic light emitting display apparatus, the second electrode layer 134 can be formed over an entire active area on which an image is formed. The second electrode layer 134 can act as a cathode by being connected to an external terminal (not shown). The first electrode layer 131 and the second electrode layer 134 can have opposite polarities.

The organic light emitting layer 133 arranged between the first electrode layer 131 and the second electrode layer 134 emits white light when the first electrode layer 131 and the second electrode layer 134 are electrically driven. The white light emitted by the organic light emitting layer 133 can have a color reproduction index (CRI) of 75 or less and can have international commission on illumination (CIE) coordinates near (0.33, 0.33). However, the present invention is not limited thereto.

The organic light emitting layer 133 can be made out of a low molecular organic monomolecular material or a high molecular organic material. When the organic light emitting layer 133 is made out of a low molecular organic material, the organic light emitting layer 133 can be formed by stacking a hole transport layer (HTL) and a hole injection layer (HIL) in the direction of the first electrode layer 131, and an electron transport layer (ETL) and an electron injection layer (EIL) in the direction of the second electrode layer 134. Of course, the organic light emitting layer 133 can be formed by stacking various layers other than the HTL, HIL, ETL, and EIL if necessary.

If the organic light emitting layer 133 is made out of a high molecular organic material, the organic light emitting layer 133 can include only an HTL in the direction of the first electrode layer 131. The HTL is formed by applying poly-(2, 4)-ethylene-dihydroxy thiophene (PEDOT) or polyaniline (PANI) to the first electrode layer 131 by inkjet printing or spin coating.

The organic light emitting layer 133 can produce white light by using wavelength conversion, e.g., wavelength down conversion, in which a phosphor is excited by blue or violet light to emit various colors and the emitted various colors are mixed to form a wide wavelength spectrum or by color mixing in which two primary colors, e.g., blue and orange, or three primary colors, e.g., red, green, and blue, are mixed to form white light. However, the present invention is not limited thereto, and various materials and methods can be used to form white light.

The encapsulation substrate 140, for preventing external moisture or oxygen from penetrating into the organic light emitting device 130 arranged on the substrate 110, is arranged over the organic light emitting device 130. The encapsulation substrate 140 of the top emission type organic light emitting display apparatus 100 of FIG. 1 is a transparent substrate made out of a glass material.

When the encapsulation substrate 140 is a transparent substrate made out of a glass material, the encapsulation substrate 140 and the substrate 110 can be sealed by a sealing member (not shown), such as frit glass with high sealing power, to form a sealed space so that oxygen and moisture can be prevented from penetrating into the sealed space without having to install a separate humectant in the sealed space.

The polarizing film 150 is arranged on the encapsulation substrate 140. The polarizing film 150 is a circular polarizing film formed by adhering a linear polarizer to a phase retarder.

A conventional organic light emitting display apparatus requires a patterning process of forming black matrix patterns corresponding to non-pixel regions of the organic light emitting device 130 on the encapsulation substrate 140 in order to prevent external light incident onto the encapsulation substrate 140 from being reflected by reflective layers, such as the reflective first electrode layer 130. However, since the circular polarizing film 150 is attached to the encapsulation substrate 140, the organic light emitting display apparatus 100 of FIG. 1 can simply reduce the reflection of external light and improve contrast without performing a complicated patterning process.

The color filter 160 is patterned directly on a side surface of the polarizing film 150 facing the encapsulation substrate 140. The color filter 160 includes a red light transmitting region 161 through which light in a red wavelength band passes, and a green light transmitting region 162 through which light in a green wavelength band passes, and a blue light transmitting region 163 through which light in a blue wavelength band passes. The red, green, and blue light transmitting regions 161, 162, and 163 respectively correspond to light emitting regions of the organic light emitting device 130. Accordingly, white light emitted by the organic light emitting layer 133 is passed through the color filter 160 so that the white light is divided into predetermined color components.

The color filter 160 can be patterned directly on the polarizing film 150 by photolithography so that the red, green, and blue light transmitting regions 161, 162, and 163 correspond to the light emitting regions of the organic light emitting device 130. Alternatively, the color filter 160 can be patterned directly on the polarizing film 150 by laser induced thermal imaging (LITI) so that the red, green, and blue light transmitting regions 161, 162, and 163 correspond to the light emitting regions of the organic light emitting device 130. In LITI, a donor film (not shown) on which a light to heat conversion (LTHC) layer (not shown) and a color filter transfer layer (not shown) are formed is aligned with and adhered to the polarizing film 150 that acts as a receptor, and laser beams are transmitted to the donor film.

When the color filter 160 is formed by the LITI technique, the color filter transfer layer formed on the donor film can be made out of a material including 1~10 wt % organic pigment, 0.1~5 wt % dispersant, 1~10 wt % acrylic resin, 50~80 wt % propylene glycol monomethylether acetate, or 10~20 wt % cyclohexanone. Since the LITI does not require a separate chemical process, the color filter 160 can be more easily formed and less damage to the polarizing film 150 is caused than when a photolithography technique is used.

The adhesive layer 170 for adhering the polarizing film 150 to the encapsulation substrate 140 can be further arranged on the polarizing film 150 on which the color filter 160 is patterned. The adhesive layer 170 of FIG. 1 is arranged in spaces between the light transmitting regions of the color filter 160 so that the organic light emitting device 130 can be protected from external shock while the polarizing film 150 is adhered to the encapsulation substrate 140. Although the adhesive layer 170 is formed in the spaces between the light transmitting regions of the patterned color filter 160 in FIG. 1, the present invention is not limited thereto, and the adhesive layer 170 can be formed at any position as long as it can adhere the polarizing film 150 to the encapsulation substrate 140.

Accordingly, the organic light emitting display apparatus 100 of FIG. 1 can improve contrast without requiring a black matrix, and can simplify the manufacture of the color filter 160 by directly forming the color filter 160 on the polarizing film 150 and not on the encapsulation substrate 140.

Figure 2:
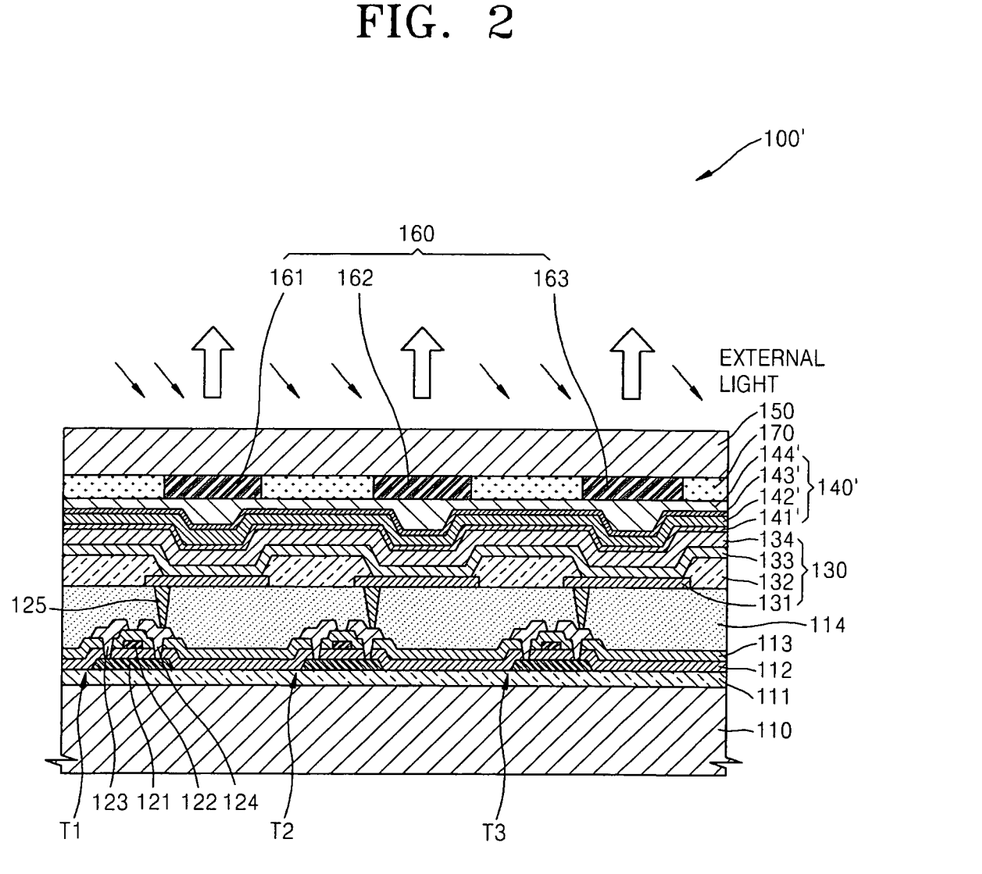
FIG. 2 is a cross-sectional view illustrating a modification of the organic light emitting display apparatus of FIG. 1.

FIG. 2 is a cross-sectional view illustrating a modification of the organic light emitting display apparatus 100 of FIG. 1. The following explanation will be made focusing on a difference between FIG. 1 and FIG. 2.

Referring to FIG. 2, the modified organic light emitting display apparatus 100' includes the substrate 110 including the plurality of TFTs T1, T2, and T3, the organic light emitting device 130, an encapsulating layer 140' including organic layers 142' and 144' and inorganic layers 141' and 143' which are alternately stacked, the polarizing film 150, color filter 160 and the adhesive layer 170 are arranged on the encapsulating layer 140'.

The organic light emitting display apparatus 100' of FIG. 2 is a top emission AM type organic light emitting display apparatus, like the organic light emitting display apparatus 100 of FIG. 1. The same reference numerals denote the same elements in FIGS. 1 and 2.

In order to prevent the penetration of external moisture or oxygen, while the encapsulation substrate 140 made out of a glass material is formed on the organic light emitting device 130 in FIG. 1, the encapsulating layer 140', including the inorganic layers 141' and 143' and the organic layers 142' and 144' that are alternately stacked, is formed on the organic light emitting device 130 in FIG. 2.

Each of the organic layers 142' and 144' can include parylene(poly-p-xylylene (PPX), poly-2-chloro-p-zylylene (PCPX), or poly[2-methoxy-r-(2'ethyhexylloxy)-1,4-phenylene vinylene]. Each of the inorganic layers 141 and 143 can include aluminum oxide (AlO), zinc oxide (ZnO), titanium oxide, tantalum oxide, zirconium oxide ($ZrO_2$), hafnium oxide ($HfO_2$), silicon oxide ($SiO_2$), silicon nitride (SiN), aluminum nitride (AlN), aluminum oxynitride (AlON), tantalum nitride (TaN), or titanium nitride (TiN). Although the two inorganic layers 141' and 143' and the two organic layers 142' and 144' are alternately stacked in FIG. 2, the present invention is not limited thereto and the number and the order of stacked layers constituting the encapsulating layer 140' can be modified.

The circular polarizing film 150, that is formed by adhering a linear polarizer to a phase retarder, is arranged on the encapsulating layer 140', thereby reducing the reflection of external light and improving contrast. The color filter 160 is patterned directly on a side surface of the polarizing film 150 facing the encapsulating layer 140', and the adhesive layer 170 for adhering the polarizing film 150 to the encapsulating layer 140', can be further arranged on the polarizing film 150 on which the color filter 160 is patterned. Since the encapsulating layer 140' of FIG. 2 is a layer and not a substrate, the organic light emitting display apparatus 100' of FIG. 2 can be slimmer than the organic light emitting display apparatus 100 of FIG. 1.

Figure 3:
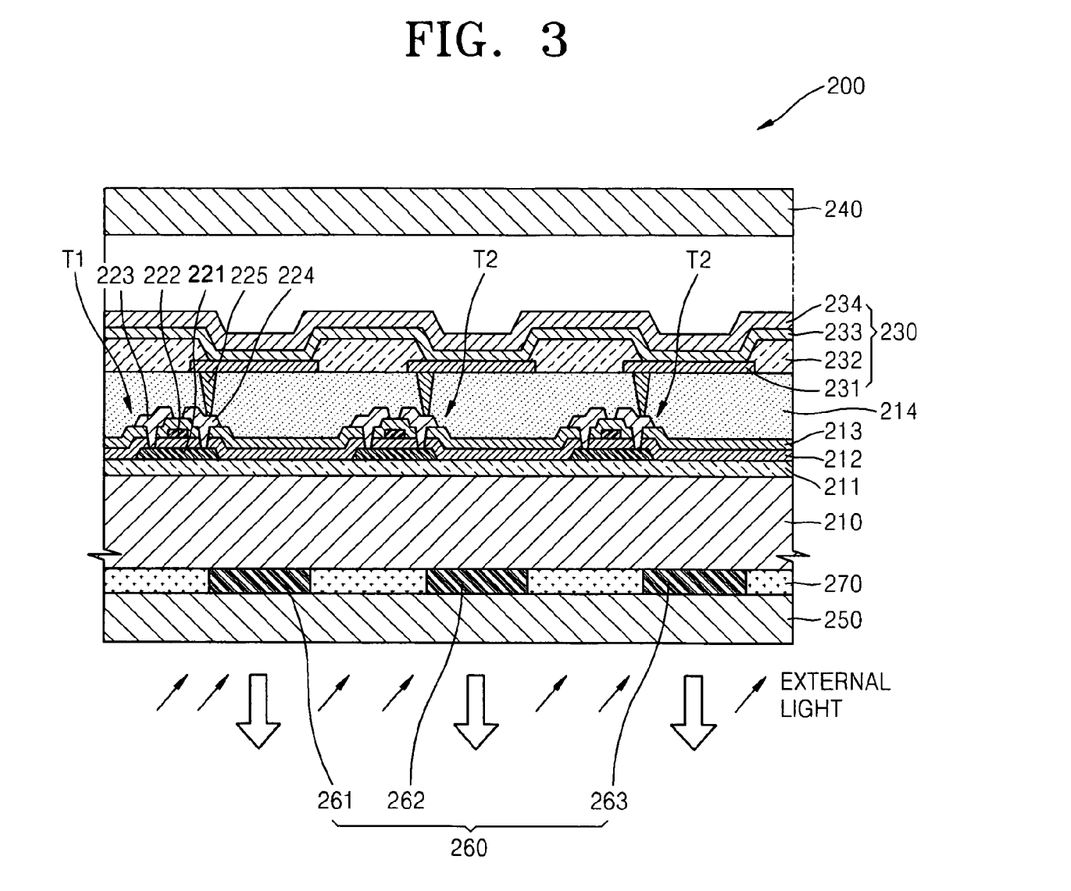
FIG. 3 is a cross-sectional view of an organic light emitting display apparatus according to another embodiment of the present invention.
Figure 4:
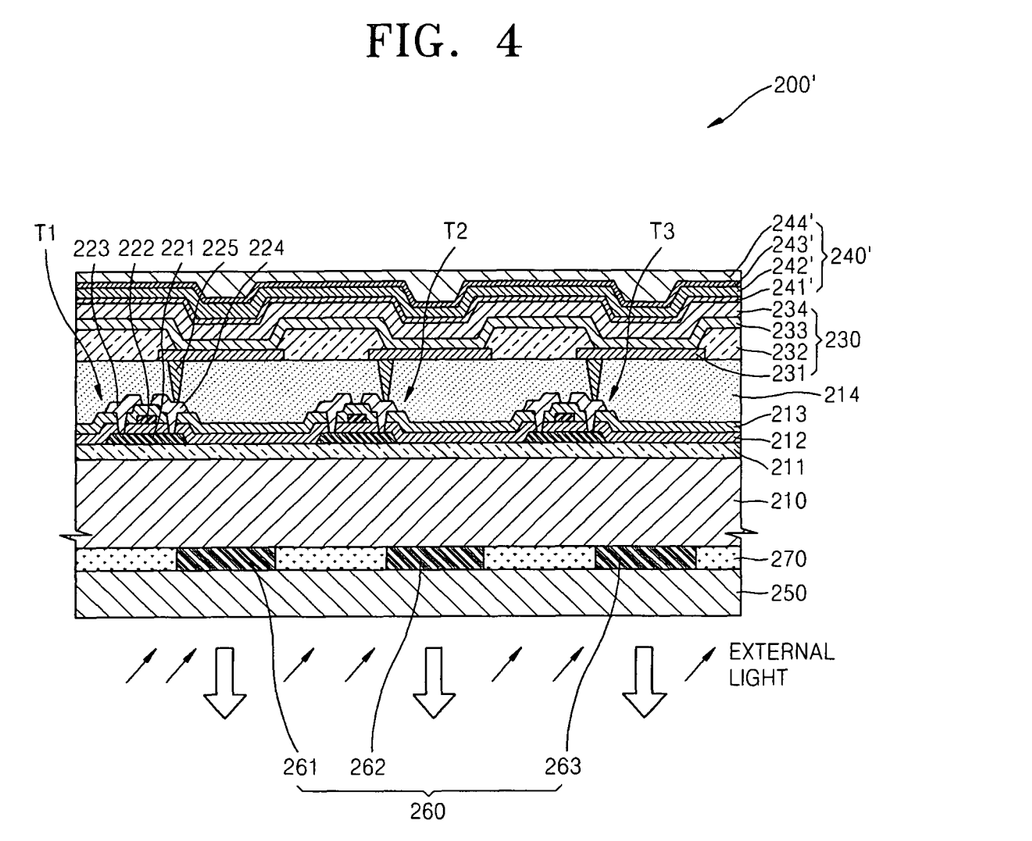
FIG. 4 is a cross-sectional view illustrating a modification of the organic light emitting display apparatus of FIG. 3.

Another embodiment of the present invention will now be explained with reference to FIGS. 3 and 4 in detail. FIG. 3 is a cross-sectional view of an organic light emitting display apparatus 200 according to another embodiment of the present invention. FIG. 4 is a cross-sectional view illustrating a modification of the organic light emitting display apparatus 200 of FIG. 3. Although the organic light emitting display apparatus 200 of FIG. 3 is an AM type organic light emitting display apparatus, the present invention is not limited thereto and the organic light emitting display apparatus 200 of FIG. 3 can instead be a PM type organic light emitting display apparatus.

Referring to FIG. 3, the organic light emitting display apparatus 200 includes a substrate 210, a plurality of TFTs T1, T2, and T3, an organic light emitting device 230, an encapsulation substrate 240, and a polarizing film 250, a color filter 260 and an adhesive layer 270 are arranged on the substrate 210.

The substrate 210 can be made out of a transparent glass material containing $SiO_2$ as a main component. Since the organic light emitting display apparatus 200 of FIG. 3 is a bottom emission type organic light emitting display apparatus in which an image is formed in the direction of the substrate 210, it is necessary for the substrate 210 to be made out of a transparent material.

A buffer layer 211, for improving the smoothness of the substrate 210 and preventing impurities from penetrating into the substrate 210, can be formed on a top surface of the substrate 210. Since the material and the manufacturing method of the buffer layer 211 are the same as described with reference to the buffer layer 111 of FIG. 1, a repeated explanation will not be given.

The plurality of TFTs T1, T2, and T3 are formed on the buffer layer 211. At least one TFT constitutes a pixel and is electrically connected to the organic light emitting device 230.

A semiconductor layer 221 having a predetermined pattern is formed on the buffer layer 211. The semiconductor layer 221 can be made out of an organic semiconductor material or an inorganic semiconductor material such as amorphous silicon or poly-silicon. Although not shown, the semiconductor layer 221 can include a source region, a drain region, and a channel region.

A gate insulating layer 212 made out of $SiO_2$ or $SiN_x$ is formed on the semiconductor layer 221, and a gate electrode 222 is formed on a predetermined portion of the gate insulating layer 221. The gate electrode 222 is connected to a gate line (not shown) that applies a TFT on/off signal.

An inter-layer insulating layer 213 is formed on the gate electrode 222, and a source electrode 223 and a drain electrode 224 contact the source region and the drain region of the semiconductor layer 221, respectively, through contact holes. The TFTs T1, T2, and T3 constructed as described above are covered and protected by a passivation layer 214.

The passivation layer 214 can be an inorganic insulating layer and/or an organic insulating layer. The passivation layer 214 can be a double layer in which an inorganic insulating layer and an organic insulating layer are stacked on each other. The material of each of the inorganic insulating layer and the organic insulating layer is the same as described with reference to FIG. 1, and thus a repeated explanation will not be given.

Although the organic light emitting display apparatus 200 of FIG. 3 is of a bottom emission type and the TFTs T1, T2, and T3 are accordingly configured, the present invention is not limited thereto, and it will be understood by one of ordinary skill in the art that the number and shape of the TFTs can be modified.

The organic light emitting device 230 is arranged on the passivation layer 214. The organic light emitting device 230 includes a first electrode layer 231 and a second electrode layer 234 placed opposite to each other, and an organic light emitting layer 233 arranged between the first electrode layer 231 and the second electrode layer 234. The first electrode layer 231 is shown electrically connected to drain electrode 224 via contact 225 extending through passivation layer 214.

The first electrode layer 231 can include a transparent layer made out of ITO, IZO, ZnO, or $In_2O_3$ that have a high work function. The first electrode layer 231 can include stripe-shaped lines which are spaced apart from one another by a predetermined distance if the organic light emitting display apparatus 200 of FIG. 3 is a PM type organic light emitting display apparatus. However, since the organic light emitting display apparatus 200 of FIG. 3 is an AM type organic light emitting display apparatus, the first electrode layer 231 can be formed into patterns corresponding to respective pixels. The first electrode layer 231 can act as an anode by being connected to an external terminal (not shown).

A pixel defining layer (PDL) 232, made out of an insulating material, is formed on the first electrode layer 231 to cover the first electrode layer 231. A predetermined opening is formed in the PDL 232, and the organic light emitting layer 233 of the organic light emitting device 230 is formed in the opening. When the organic light emitting display apparatus 200 emits white light, the organic light emitting layer 233 is not only formed in the opening, but can instead be formed on both the first electrode layer 231 and the entire PDL 232 as shown in FIG. 3.

The second electrode layer 234 can be a reflective electrode made out of a material with a low work function, such as Li, Ca, LiF/Ca, LiF/Al, Al, Mg, or Ag. The second electrode layer 234 can include stripe-shaped lines orthogonal to the stripe-shaped lines of the first electrode layer 231 if the organic light emitting display apparatus 200 of FIG. 3 is a PM type organic light emitting display apparatus. However, since the organic light emitting display apparatus 200 of FIG. 3 is an AM type organic light emitting display apparatus, the second electrode layer 234 can be formed over an entire active area on which an image is formed. The second electrode layer 234 can act as a cathode by being connected to an external terminal (not shown).

The first electrode layer 231 and the second electrode layer 234 can have opposite polarities. The organic light emitting layer 233 arranged between the first electrode layer 231 and the second electrode layer 234 emits white light as a result of the first electrode layer 231 and the second electrode layer 234 being electrically driven. The material and structure of the white light producing organic light emitting layer 233 are the same as those described with reference to FIG. 1, and thus a repeated explanation will not be given.

The encapsulation substrate 240, for preventing external moisture or oxygen from penetrating into the organic light emitting device 230 arranged on the substrate 210, is arranged on the organic light emitting device 230. The encapsulation substrate 240 of the bottom emission type organic light emitting display apparatus 200 of FIG. 3 can be a transparent substrate made out of a glass material, or can be made out of an opaque material such as metal or plastic. When the encapsulation substrate 240 is used as an encapsulating member, the encapsulation substrate 240 and the substrate 210 can be sealed by a sealing member (not shown) such as frit glass having a high sealing power to form a sealed space so that oxygen and moisture can be prevented from penetrating into the sealed space. This sealing member allows the device to be designed without having to include a separate humectant within the sealed space.

The polarizing film 250 is arranged on the substrate 210. Light emitted by the organic light emitting layer 233 travels through the polarizing film 250. The polarizing film 250 is a circular polarizing film formed by adhering a linear polarizer to a phase retarder.

A conventional organic light emitting display apparatus requires a patterning process to form a patterned black matrix layer that corresponds to non-pixel regions of the organic light emitting device 230 in order to prevent external light incident from the substrate 210 from being reflected by reflective layers including the reflective layer of the second electrode layer 234. However, since the circular polarizing film 250 is attached to the substrate 210, the organic light emitting display apparatus 200 of FIG. 3 reduces the reflection of external light and improve contrast without performing a complicated patterning process.

The color filter 260 is patterned directly on the polarizing film 250. The color filter 260 includes a red light transmitting region 261 through which light in a red wavelength band passes, a green light transmitting region 262 through which light in a green wavelength band passes, and a blue light transmitting region 263 through which light in a blue wavelength band passes. The red, green, and blue light transmitting regions 261, 262, and 263 respectively correspond to light emitting regions of the organic light emitting device 230. Accordingly, white light emitted by the organic light emitting layer 233 is passes through the substrate 210 and the color filter 260 so that the white light is divided into predetermined color components.

The color filter 260 can be patterned directly on the polarizing film 250 by a photolithography technique so that the red, green, and blue light transmitting regions 261, 262, and 263 correspond to the light emitting regions of the organic light emitting device 230. Alternatively, the color filter 260 can be patterned directly on the polarizing film 250 by a LITI technique so that the red, green, and blue light transmitting regions 261, 262, and 263 correspond to the light emitting regions of the organic light emitting device 230. In the LITI technique, a donor film (not shown), on which a light-to-heat conversion (LTHC) layer (not shown) and a color filter transfer layer (not shown) are formed, is aligned with and adhered to the polarizing film 250 that acts as a receptor, and laser beams are transmitted to the donor film.

The adhesive layer 270, for adhering the polarizing film 250 to the substrate 210, can be further arranged on the polarizing film 250 on which the color filter 260 is patterned. The adhesive layer 270 of FIG. 3 is arranged in spaces between ones of the light transmitting regions of the color filter 260 so that the organic light emitting device 230 can be protected from external shock while the polarizing film 250 is adhered to the substrate 210. Although the adhesive layer 270 is formed in the spaces between ones of the light transmitting regions of the color filter 260 in FIG. 3, the present invention is not limited thereto, and the adhesive layer 270 can instead be formed at any position as long as it can adhere the polarizing film 250 to the substrate 210. Accordingly, the organic light emitting display apparatus 200 of FIG. 3 can improve contrast without having to include a black matrix, and can simplify the manufacture the color filter 260 by forming the color filter 260 directly on the polarizing film 250 and not in the substrate 210.

FIG. 4 is a cross-sectional view illustrating a modification of the organic light emitting display apparatus 200 of FIG. 3. The following explanation will be made focusing on a difference between FIG. 3 and FIG. 4.

Referring to FIG. 4, an organic light emitting display apparatus 200' includes the substrate 210 including the plurality of TFTs T1, T2, and T3, the organic light emitting device 230, an encapsulating layer 240' including organic layers 242' and 244' and inorganic layers 241' and 243' which are alternately stacked, the polarizing film 250, color filter 260 and the adhesive layer 270 are arranged on the substrate 210.

The organic light emitting display apparatus 200' of FIG. 4 is a bottom emission AM type organic light emitting display apparatus like the organic light emitting display apparatus 200 of FIG. 3. The same reference numerals denote the same elements in FIGS. 3 and 4.

In order to prevent the penetration of external moisture or oxygen, while the encapsulation substrate 240 made out of a glass material is formed on the organic light emitting device 230 in FIG. 3, the encapsulating layer 240', including the inorganic layers 241' and 243' and the organic layers 242' and 244' which are alternately stacked, is formed on the organic light emitting device 230 in FIG. 4. The material of each of the organic and inorganic layers making up the encapsulating layer 240' is the same as that described in FIG. 2, and thus a repeated explanation will not be given.

The circular polarizing film 250, that is formed by adhering a linear polarizer to a phase retarder, is arranged on the substrate 210, thereby reducing the reflection of external light and improving contrast. The color filter 260 is patterned directly onto the polarizing film 250, and the adhesive layer 270, for adhering the polarizing film 250 to the substrate 210, can be further arranged on the polarizing film 250 on which the color filter 260 is patterned.

Since the encapsulating layer 240' of FIG.4 is a layer and not a substrate, the organic light emitting display apparatus 200' of FIG. 4 can be slimmer than the organic light emitting display apparatus 200 of FIG. 3. Accordingly, the organic light emitting display apparatus 200' of FIG. 4 can improve contrast without requiring a black matrix, and can simplify the manufacture of the color filter 260 by directly forming the patterned color filter 260 on the polarizing film 250 and not in the substrate 210.

As described above, the organic light emitting display apparatus according to the present invention can improve contrast without requiring a black matrix while simplifying the manufacture of the color filter by forming the patterned color filter directly on the polarizing film and not on either of the substrate or the encapsulation substrate.

While the present invention has been particularly shown and described with reference to exemplary embodiments thereof, it will be understood by those of ordinary skill in the art that various changes in form and details can be made therein without departing from the spirit and scope of the present invention as defined by the following claims.

What is claimed is:

1. A top emission type organic light emitting display apparatus, comprising:
    a substrate;
    an organic light emitting device arranged on the substrate and including a first electrode layer and a second electrode layer arranged opposite to each other and an organic light emitting layer arranged between the first electrode layer and the second electrode layer, wherein the organic light emitting device is adapted to emit white light;
    an encapsulating member arranged to encapsulate the organic light emitting device;
    a polarizing film arranged on the encapsulating member;
    a color filter arranged between the encapsulating member and the polarizing film, the color filter being arranged directly on the polarizing film, the color filter including:
    a red light transmitting region through which light in a red wavelength band passes, a blue light transmitting region through which light in a blue wavelength band passes, and a green light transmitting region through which light in a green wavelength band passes; and
    an adhesive layer arranged only in spaces between adjacent ones of the red, green and blue light transmitting regions of the color filter arranged on the polarizing film, the adhesive layer being absent of a black matrix.

2. A bottom emission type organic light emitting display apparatus, comprising:
    a transparent substrate;
    an organic light emitting device arranged on the substrate and including a first electrode layer and a second electrode layer arranged opposite to each other and an organic light emitting layer arranged between the first electrode layer and the second electrode layer, wherein the organic light emitting device is adapted to emit white light;
    an encapsulating member arranged to encapsulate the organic light emitting device;
    a polarizing film arranged on the substrate;
    a color filter arranged between the substrate and the polarizing film, the color filter being arranged directly on the polarizing film, the color filter including:
    a red light transmitting region through which light in a red wavelength band passes; a blue light transmitting region through which light in a blue wavelength band passes; and a green light transmitting region through which light in a green wavelength band passes; and
    an adhesive layer arranged only in spaces between adjacent ones of the red, green and blue light transmitting regions of the color filter arranged on the polarizing film, the adhesive layer being absent of a black matrix.

3. The organic light emitting display apparatus of claim 1, wherein the red light transmitting region, the blue light transmitting region, and the green light transmitting region are arranged to correspond to light emitting regions of the organic light emitting device.

4. The organic light emitting display apparatus of claim 1, wherein the color filter is produced directly on the polarizing film by a photolithography process.

5. The organic light emitting display apparatus of claim 1, wherein the color filter is produced directly on the polarizing film by a laser induced thermal imaging (LITI) process.

6. The organic light emitting display apparatus of claim 1, wherein the encapsulating member is a substrate comprised of a glass material.

7. The organic light emitting display apparatus of claim 6, further comprising a sealing member arranged on the substrate to seal the encapsulating member and the substrate.

8. The organic light emitting display apparatus of claim 7, wherein the sealing member is comprised of frit glass.

9. The organic light emitting display apparatus of claim 1, wherein the encapsulating member comprises a plurality of organic layers and a plurality of inorganic layers which are alternately stacked.

10. The organic light emitting display apparatus of claim 1, wherein the organic light emitting device is a passive matrix type organic light emitting device.

11. The organic light emitting display apparatus of claim 1, wherein the organic light emitting device is an active matrix type organic light emitting device.

12. The organic light emitting display apparatus of claim 1, further comprising a buffer layer arranged on the substrate.

13. The organic light emitting display apparatus of claim 1, wherein the polarizing film is comprised of a linear polarizer adhered to a phase retarder.

14. The organic light emitting display apparatus of claim 1, the display apparatus being absent of any black matrix forming material.

15. The organic light emitting display apparatus of claim 2, the display apparatus being absent of any black matrix forming material.

* * * * *